US011329258B2

(12) United States Patent
Gong et al.

(10) Patent No.: US 11,329,258 B2
(45) Date of Patent: May 10, 2022

(54) DISPLAY PANEL AND MANUFACTURE METHOD THEREOF, DISPLAY DEVICE

(71) Applicants: HEFEI BOE OPTOELECTRONICS TECHNOLOGY CO., LTD., Anhui (CN); BOE TECHNOLOGY GROUP CO., LTD., Beijing (CN)

(72) Inventors: Kui Gong, Beijing (CN); Xianxue Duan, Beijing (CN); Cheng Chen, Beijing (CN); Dezhi Xu, Beijing (CN); Chengcheng Wang, Beijing (CN)

(73) Assignees: HEFEI BOE OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 626 days.

(21) Appl. No.: 16/323,611

(22) PCT Filed: May 23, 2018

(86) PCT No.: PCT/CN2018/088031
§ 371 (c)(1),
(2) Date: Feb. 6, 2019

(87) PCT Pub. No.: WO2019/041899
PCT Pub. Date: Mar. 7, 2019

(65) Prior Publication Data
US 2021/0328193 A1    Oct. 21, 2021

(30) Foreign Application Priority Data

Aug. 31, 2017    (CN) .................. 201710771763.X

(51) Int. Cl.
*H01L 51/52*    (2006.01)
*H01L 27/32*    (2006.01)
*H01L 51/56*    (2006.01)

(52) U.S. Cl.
CPC ...... *H01L 51/5271* (2013.01); *H01L 27/3258* (2013.01); *H01L 51/56* (2013.01);
(Continued)

(58) Field of Classification Search
CPC . H01L 51/5271; H01L 27/3258; H01L 51/56; H01L 27/3246; H01L 2251/5307; H01L 2227/323
See application file for complete search history.

(56) References Cited

U.S. PATENT DOCUMENTS

2004/0160165 A1* 8/2004 Yamauchi ........... H01L 51/5271
                                                                    313/498
2013/0214301 A1* 8/2013 Yamada .............. H01L 51/5262
                                                                    257/88

(Continued)

FOREIGN PATENT DOCUMENTS

CN        102165845 A    8/2011
CN        103258838 A    8/2013
(Continued)

OTHER PUBLICATIONS

International Search Report and Written Opinion dated Aug. 27, 2018; PCT/CN2018/088031.
(Continued)

*Primary Examiner* — Kevin Quarterman

(57) ABSTRACT

A display panel, a display device and a manufacture method of a display panel are provided. The display panel includes a base substrate, a plurality of pixel units disposed in an array and a total reflection structure. Each of the plurality of pixel units includes a light emitting region and a light emitting device in the light emitting region; and the total reflection structure is disposed on a light exiting side of the light emitting device and surrounds at least a portion of the light emitting region; the total reflection structure includes a main structure and a second structure covering a side, which
(Continued)

faces the light emitting device, of the main structure, and a refractive index of the second structure is greater than a refractive index of the main structure.

19 Claims, 13 Drawing Sheets

(52) U.S. Cl.
CPC .... *H01L 27/3246* (2013.01); *H01L 2227/323* (2013.01); *H01L 2251/5307* (2013.01)

(56) References Cited

U.S. PATENT DOCUMENTS

| | | | |
|---|---|---|---|
| 2013/0234590 A1* | 9/2013 | Li | ..................... H01L 27/3246 313/509 |
| 2015/0372066 A1 | 12/2015 | Choi et al. | |
| 2016/0178812 A1* | 6/2016 | Gao | ..................... G02B 5/003 257/88 |
| 2017/0092707 A1 | 3/2017 | Wang | |
| 2017/0213882 A1* | 7/2017 | Teramoto | ............ H01L 27/3276 |

FOREIGN PATENT DOCUMENTS

| | | |
|---|---|---|
| CN | 105932040 A | 9/2016 |
| CN | 107579166 A | 1/2018 |
| CN | 207116482 U | 3/2018 |

OTHER PUBLICATIONS

The Extended European Search Report dated Jul. 28, 2021; Appln. No. 18839664.2.

* cited by examiner

DISPLAY PANEL AND MANUFACTURE METHOD THEREOF, DISPLAY DEVICE

The application claims priority to Chinese patent application No. 201710771763.X, filed on Aug. 31, 2017, the entire disclosure of which is incorporated herein by reference as part of the present application.

TECHNICAL FIELD

At least one embodiment of the present disclosure relates to a display panel, a display device and a manufacture method of a display panel.

BACKGROUND

Organic light emitting diode (OLED) display devices have advantages of self-luminescence, fast response, high brightness, bright color, light weight, low energy consumption and so on, and has attracted more and more attention. OLED display technologies have gradually been applied to mobile phones, computer monitors, televisions and the like.

SUMMARY

At least one embodiment of the present disclosure provides a display panel, and the display panel comprises a base substrate, a plurality of pixel units disposed in an array and a total reflection structure. Each of the plurality of pixel units comprises a light emitting region and a light emitting device in the light emitting region; and the total reflection structure is disposed on a light exiting side of the light emitting device and surrounds at least a portion of the light emitting region; the total reflection structure comprises a main structure and a second structure covering a side, which faces the light emitting device, of the main structure, and a refractive index of the second structure is greater than a refractive index of the main structure.

For example, in the display panel provided by an embodiment of the present disclosure, the second structure of the total reflection structure further covers an upper surface, which is away from the base substrate, of the main structure.

For example, in the display panel provided by an embodiment of the present disclosure, the second structure of the total reflection structure is further configured to be a planarization layer covering the base substrate, and an upper surface, which is away from the base substrate, of the planarization layer and the upper surface, which is away from the base substrate, of the main structure of the total reflection structure are substantially flush; alternatively, the planarization layer covers the main structure of the total reflection structure.

For example, in the display panel provided by an embodiment of the present disclosure, a cross-sectional shape of the main structure of the total reflection structure along a direction perpendicular to the base substrate is a trapezoidal shape or a rectangular shape.

For example, in the display panel provided by an embodiment of the present disclosure, a material of the total reflection structure is a transparent material.

For example, in the display panel provided by an embodiment of the present disclosure, a material of the main structure of the total reflection structure is a first inorganic material or a first resin material, and a material of the second structure of the total reflection structure is a second inorganic material or a second resin material; the first inorganic material and the second inorganic material are different, and the first resin material and the second resin material are different.

For example, the display panel provided by an embodiment of the present disclosure further comprises a planarization layer, the planarization layer is disposed on the base substrate and covers the total reflection structure and the base substrate, and the light emitting device is disposed on the planarization layer.

For example, in the display panel provided by an embodiment of the present disclosure, the light emitting device comprises an anode, a light emitting layer and a cathode. The anode is disposed on the planarization layer, the light emitting layer is disposed on the anode, and the cathode covers the light emitting layer. The light emitting device is of a bottom emission type.

For example, the display panel provided by an embodiment of the present disclosure further comprises a pixel driving circuit disposed on the base substrate; at least a portion of the pixel driving circuit is covered by the total reflection structure in a direction perpendicular to the base substrate.

For example, the display panel provided by an embodiment of the present disclosure further comprises a pixel definition layer, the pixel definition layer comprises a pixel dividing portion disposed between the light emitting devices and an opening portion corresponding to the light emitting region to define the plurality of pixel units.

At least one embodiment of the present disclosure provides a display device, which comprises any one of the above display panels.

At least one embodiment of the present disclosure provides a manufacture method of a display panel, the method comprises: providing a base substrate on which a plurality of pixel units are disposed in an array, each of the plurality of pixel units comprises a light emitting region; forming a light emitting device in the light emitting region; and forming a total reflection structure on a light exiting side of the light emitting device, the total reflection structure surrounds at least a portion of the light emitting region; and the total reflection structure includes a main structure and a second structure covering a side, which faces the light emitting device, of the main structure, and a refractive index of the second structure is greater than a refractive index of the main structure.

For example, in the manufacture method of a display panel provided by an embodiment of the present disclosure, the forming of the total reflection structure comprises forming a planarization layer covering the base substrate as the second structure of the total reflection structure; an upper surface, which is away from the base substrate, of the planarization layer and an upper surface, which is away from the base substrate, of the main structure of the total reflection structure are substantially flush; alternatively, the planarization layer covers the main structure of the total reflection structure.

For example, the manufacture method of a display panel provided by an embodiment of the present disclosure further comprises forming a planarization layer on the base substrate, the planarization layer covers the total reflection structure and the base substrate.

For example, in the manufacture method of a display panel provided by an embodiment of the present disclosure, the display panel further comprises a pixel driving circuit disposed on the base substrate; and at least a portion of the pixel driving circuit is covered by the total reflection structure in a direction perpendicular to the base substrate.

BRIEF DESCRIPTION OF THE DRAWINGS

In order to clearly illustrate the technical solution of the embodiments of the disclosure, the drawings used in the description of the embodiments or relevant technologies will be briefly described in the following; it is obvious that the described drawings are only related to some embodiments of the disclosure and thus are not limitative of the disclosure.

REFERENCE NUMERALS

Figure 1:
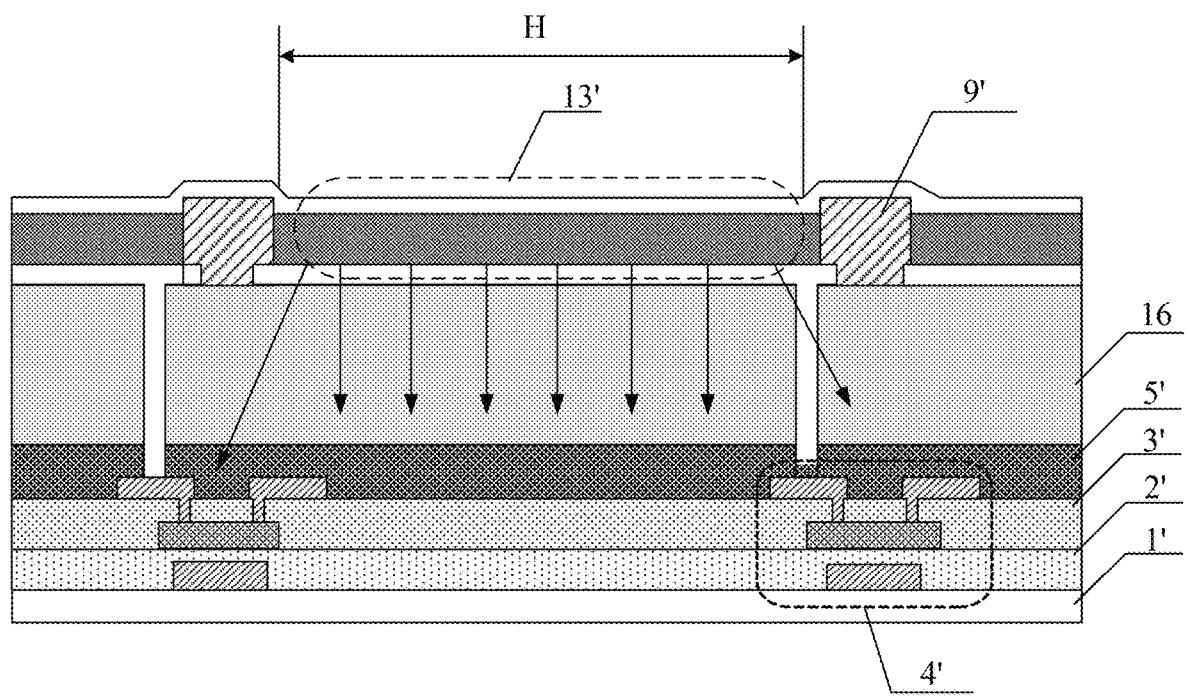
FIG. 1 is a structural schematic diagram of a display panel.

1—base substrate; 1'—base substrate; 2—gate insulating layer, 2'—gate insulating layer, 3—interlayer insulating layer, 3'—interlayer insulating layer, 4—thin film transistor, 4'—thin film transistor, 5—passivation layer, 5'—passivation layer; 6—total reflection structure; 601—main structure; 6011—upper surface of main structure; 6012—side of main structure; 602—second structure; 6021—upper surface of second structure; 6'—main structure layer; 7—anode; 7'—anode layer, 8—light emitting layer, 9—pixel definition layer, 9'—pixel definition layer; 10—display panel; 11—cathode; 12—through hole; 13—organic light emitting device; 13'—organic light emitting device; 14—mask; 15—planarization layer, 16—planarization layer; 17—driving device; 18—controller, 20—gate line; 21—data line; 100—display device; 101—light emitting region.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

The dimensions of the drawings in the present disclosure are not strictly drawn according to an actual scale, and the specific size and the number of each structure may be determined according to actual requirements. The number of the pixel units in the display panel is not limited to the number shown in the drawings, and the drawings described in the present disclosure are only structural schematic diagrams.

According to light emitting directions, OLED devices can be classified into a bottom emission type, a top emission type, a double-side emission type and so on. However, light emitted from an organic light emitting layer not only transmits in a direction perpendicular to the base substrate, but also transmits laterally, which easily forms crosstalk to light emitting states of light emitting regions of adjacent pixel units.

FIG. 1 is a structural schematic diagram of a display panel. As illustrated in FIG. 1, the display panel is an organic light emitting display panel, which comprises: a base substrate 1' and a plurality of pixel units disposed on the base substrate 1', each of the plurality of pixel units comprises a light emitting region H and a light emitting device 13' in the light emitting region H. A pixel driving circuit is disposed on the base substrate 1', the pixel driving circuit comprises a thin film transistor 4', and at least a portion of an orthographic projection of the thin film transistor 4' on the base substrate 1' is covered by an orthographic projection of a pixel definition layer 9' on the base substrate 1'. The base substrate 1' is further provided with a gate insulating layer 2' covering a gate electrode of the thin film transistor 4', an interlayer insulating layer 3' covering an active layer of the thin film transistor 4', a passivation layer covering the base substrate 1' and a planarization layer 16 on the passivation layer 5'. The display panel further comprises the pixel definition layer 9' disposed on the planarization layer 16 and surrounding edges of the light emitting region 13' for defining a plurality of pixel regions. The light emitting device 13 is disposed on the planarization layer 16, and a portion of the planarization layer 16 is covered by the pixel definition layer 9'.

The light emitting device 13' of the display panel is of a bottom emission type, and a part of the light emitted from the light emitting device 13' sequentially passes through the planarization layer 16, the passivation layer 5', the interlayer insulating layer 3' and so on, and is emitted from a lower side of the base substrate 1'. However, the light emitted from the light emitting device 13' not only transmits in a vertical direction perpendicular to the base substrate 1', but also transmits in a lateral direction parallel to the base substrate 1', for example, a part of the light transmits laterally in the planarization layer 16, the passivation layer 5' and the interlayer insulating layer 3'. Therefore, in the display panel, a part of the light emitted from the light emitting device in a certain pixel unit laterally transmits to the light emitting region of an adjacent pixel unit, and therefore crosstalk to the light emitting state of the light emitting region of the adjacent pixel unit is formed. Moreover, because light is simultaneously transmitted in the above-mentioned vertical direction and lateral direction, a part of light may be irradiated to the thin film transistor 4', resulting in a photo-induced leakage phenomenon of the thin film transistor 4', which affects the display function.

At least one embodiment of the present disclosure provides a display panel, and the display panel comprises a base substrate, a plurality of pixel units disposed in an array and a total reflection structure. Each of the plurality of pixel units comprises a light emitting region and a light emitting device in the light emitting region; and the total reflection structure is disposed on a light exiting side of the light emitting device and surrounds at least a portion of the light emitting region; the total reflection structure comprises a main structure and a second structure covering a side, which faces the light emitting device, of the main structure, and a refractive index of the second structure is greater than a refractive index of the main structure.

Figure 2:
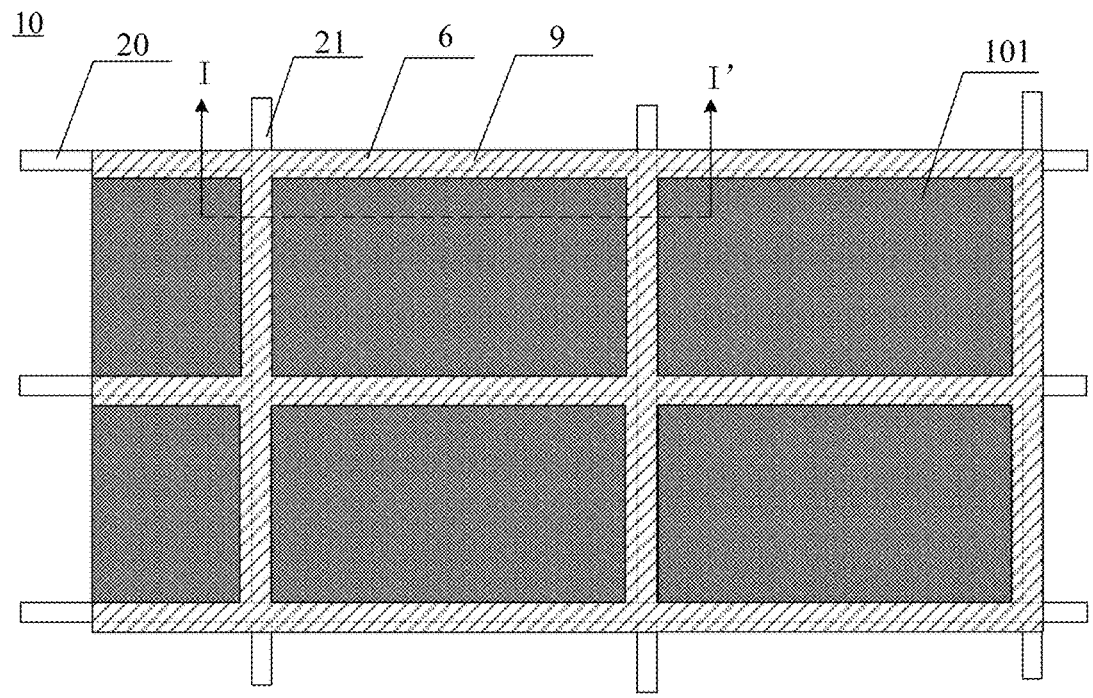
FIG. 2 is a plane schematic diagram of a display panel provided by an embodiment of the present disclosure.
Figure 3A:
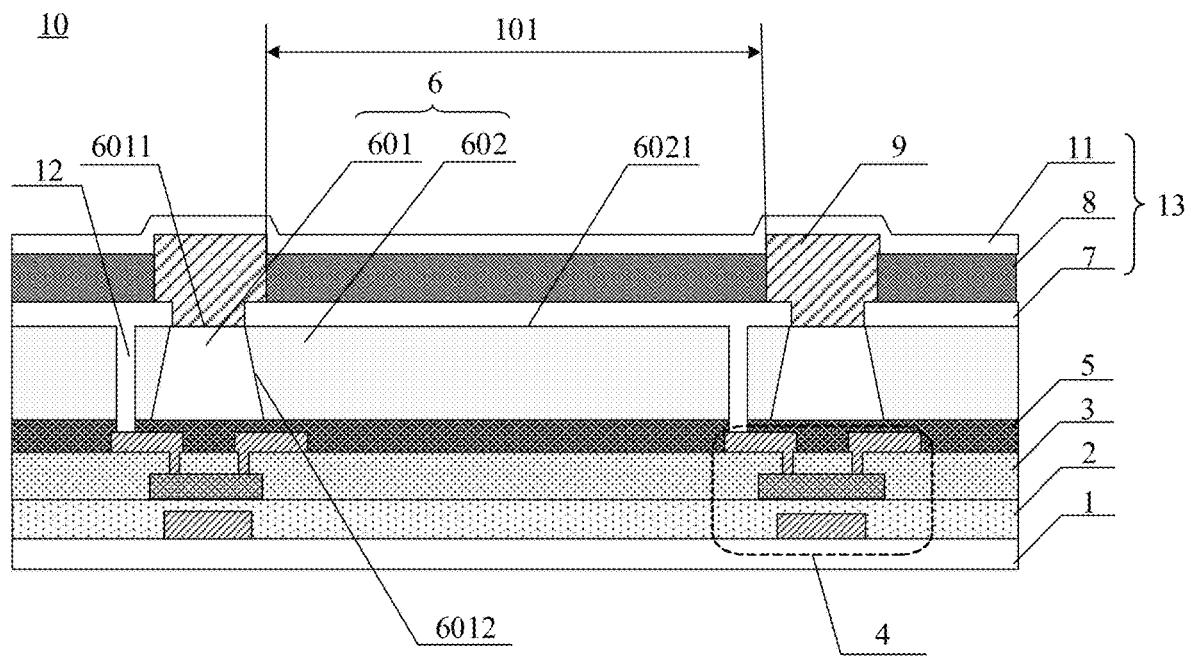
FIG. 3A is a cross-sectional schematic diagram along line I-I' of FIG. 2.
Figure 3B:
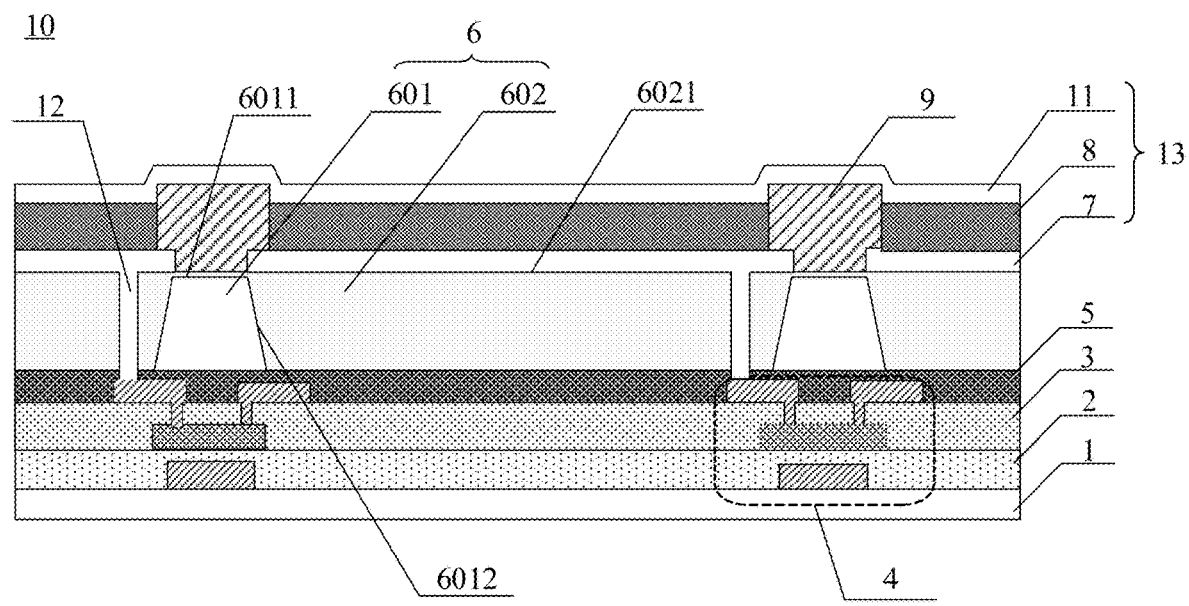
FIG. 3B is another cross-sectional schematic diagram along line I-I' of FIG. 2.
Figure 3C:
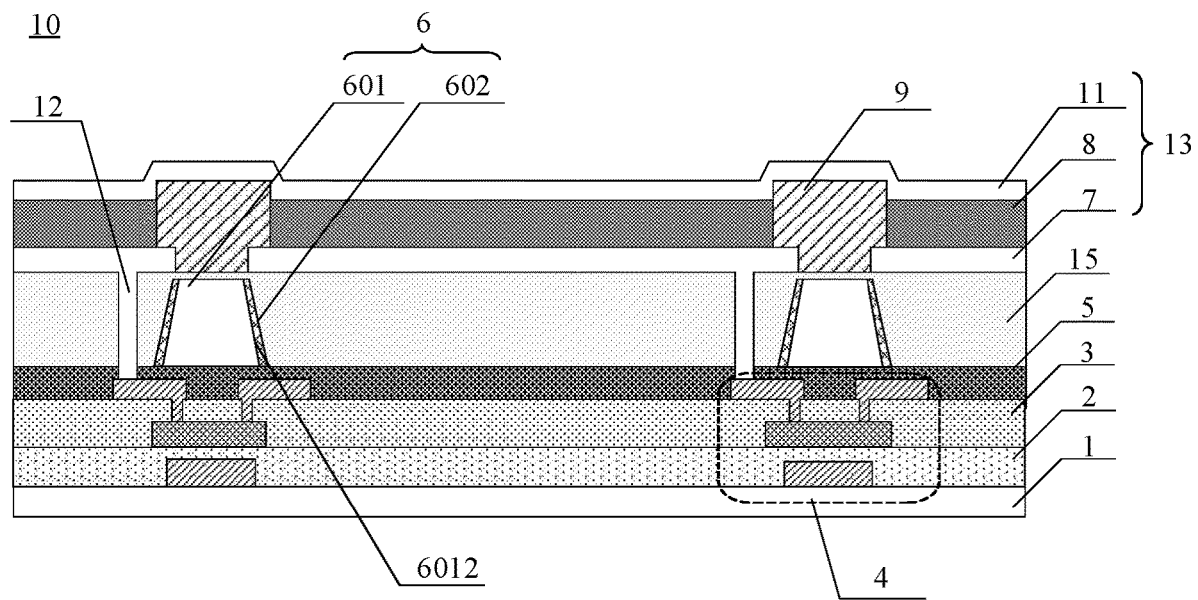
FIG. 3C is further another cross-sectional schematic diagram along line I-I' of FIG. 2.

Illustratively, FIG. 2 is a plane schematic diagram of a display panel provided by an embodiment of the present disclosure, FIG. 3A is a cross-sectional schematic diagram along line I-I' of FIG. 2; FIG. 3B is another cross-sectional schematic diagram along line I-I' of FIG. 2; and FIG. 3C is further another cross-sectional schematic diagram along line I-I' of FIG. 2.

As illustrated in FIGS. 2 and 3A, the display panel 10 comprises a base substrate 1, a plurality of pixel units disposed on the base substrate 1, and a total reflection structure 6. Each of the plurality of pixel units comprises a light emitting region 101 and a light emitting device 13 in the light emitting region 101. The total reflection structure 6 is disposed on a light exiting side of the light emitting device 13. For example, in the embodiment illustrated in FIG. 3A, a light exiting surface of the light emitting device 13 is the lower surface thereof in the figure, so the total reflection structure 6 is disposed below the light emitting device 13. For example, in the embodiment illustrated in FIG. 2, the total reflection structure 6 surrounds the entire light emitting region 101, but in other embodiments of the present disclosure, the total reflection structure 6 can also surround a portion of the light emitting region 101, namely, a plane shape of an orthographic projection of the total reflection structure 6 on the base substrate 1 is not closed. That is, the total reflection structure 6 at least surrounds at least a portion of the light emitting region 101. The total reflection structure 6 includes a main structure 601 and a second structure 602 covering a side 6012, which faces the light emitting device 13, of the main structure 601, and a refractive index of the second structure 602 is greater than a refractive index of the main structure 601. Light emitted from the light emitting device 13 transmits simultaneously in a vertical direction perpendicular to the base substrate 1 and in a lateral direction parallel to the base substrate 1, so that a part of the light transmits to the total reflection structure 6, and the light is incident from the second structure 602 to the main structure 601. Total reflection is a phenomenon that when light is emitted from a light-denser medium (a medium having a larger refractive index of light in the medium, hereinafter referred to as a larger refractive index) to a light-thinner medium (a medium having a smaller refractive index of light in the medium, hereinafter referred to as a smaller refractive index), the light is completely reflected back into the original medium at an interface between the light-denser medium and the light-thinner medium, for example, an phenomenon as illustrated in FIG. 4D, when light is emitted to an interface between two mediums, only reflection is generated and no refraction is generated. When light is emitted from the light-denser medium to the light-thinner medium, the refraction angle is greater than the incident angle. In a case where the incidence angle i increases to a certain value, the refraction angle reaches 90°, and in this situation, refracted light does not appear in the light-thinner medium, and the certain value is a critical angle $i_c$. As long as the incident angle is greater than or equal to the critical angle $i_c$, the incident light is no longer refracted, but is all reflected, which is total reflection. Necessary conditions for total reflection comprise: (1) light must be emitted from the light-denser medium to the light-thinner medium; (2) the incident angle is greater than or equal to the critical angle $i_c$. The formula of total reflection is: $i_c$=arcsin ($n_2/n_1$), where $n_1$ is a refractive index of the light-denser medium, $n_2$ is a refractive index of the light-thinner medium, and $n_1 > n_2$. In the structure illustrated in FIG. 2 and FIG. 3A, because the refractive index of the second structure 602 is larger than the refractive index of the main structure 601, light is emitted from a medium having a larger refractive index to a medium having a smaller refractive index, according to the principle of total reflection of light, in a case where the incident angle of the incident light is greater than the critical angle of the total reflection, this portion of the incident light can be totally reflected, which can prevent the light transmitting in the lateral direction (for example, non-perpendicular direction of the base substrate) from entering the light emitting region of the adjacent pixel unit or reduce the light that enters the light emitting region of the adjacent pixel unit, and alleviate or avoid the crosstalk phenomenon of light emitting state of the light emitting region of the adjacent pixel unit, so that a better display quality is realized. Moreover, the total reflection structure 6 is disposed around the light emitting region 101, so that the light emitting region is not blocked thus the light emission rate of the light emitting region 101 is reduced. Instead, the total reflection structure 6 prevents the light from transmitting in the lateral direction, thereby a light emission ratio is increased and a light utilization efficiency is improved.

For example, as illustrated in FIG. 3A, the second structure 602 of the total reflection structure 6 is a planarization layer covering the base substrate 1, and an upper surface 6021, which is away from the base substrate 1, of the planarization layer and an upper surface 6011, which is away from the base substrate 1, of the main structure of the total reflection structure are substantially flush. This is advantageous to simplifying a structure of the display panel 10, and meanwhile an effect of avoiding the light transmitting in the lateral direction from entering the light emitting region of the adjacent pixel unit or reducing the light that enters the light emitting region of the adjacent pixel unit is realized by utilizing the principle of total reflection of light. In this situation, the planarization layer may provide a flat surface for disposing the light emitting device 13 thereon.

Figure 4A:
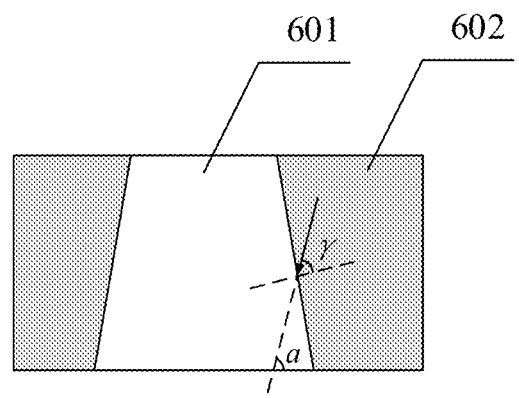
FIG. 4A is a cross-sectional schematic diagram of a total reflection structure of a display panel provided by an embodiment of the present disclosure along a direction perpendicular to a base substrate.
Figure 4B:
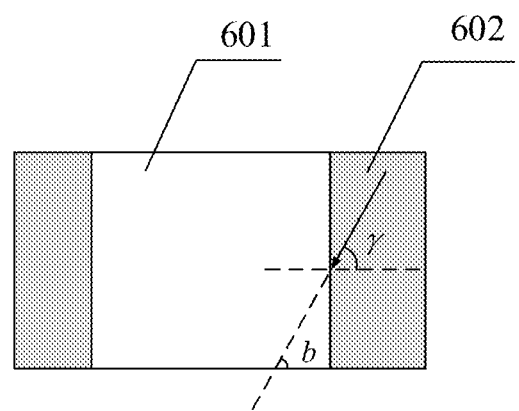
FIG. 4B is another cross-sectional schematic diagram of a total reflection structure of a display panel provided by an embodiment of the present disclosure along a direction perpendicular to a base substrate.
Figure 4C:
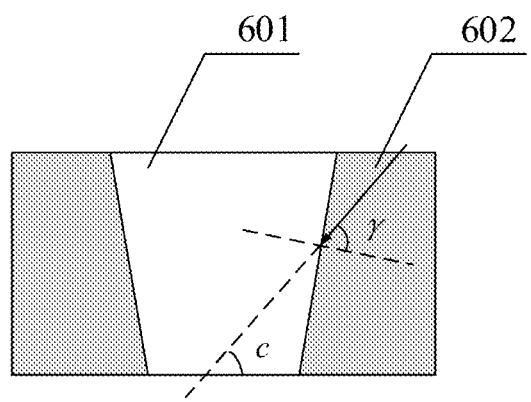
FIG. 4C is further another cross-sectional schematic diagram of a total reflection structure of a display panel provided by an embodiment of the present disclosure along a direction perpendicular to a base substrate.
Figure 4D:
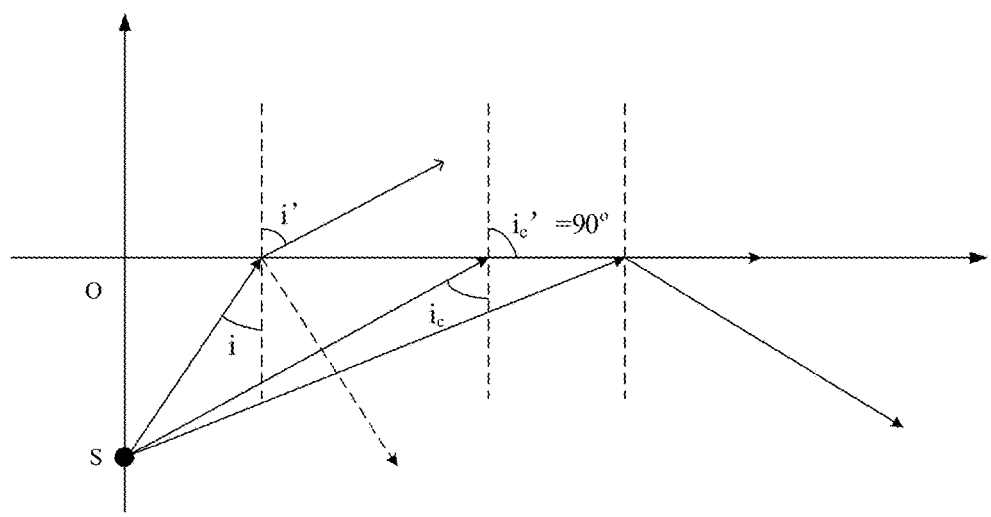
FIG. 4D is a schematic diagram of the principle of total reflection of light.

FIG. 4A is a cross-sectional schematic diagram of a total reflection structure of a display panel provided by an embodiment of the present disclosure along a direction perpendicular to a base substrate; FIG. 4B is another cross-sectional schematic diagram of a total reflection structure of a display panel provided by an embodiment of the present disclosure along a direction perpendicular to a base substrate; FIG. 4C is further another cross-sectional schematic diagram of a total reflection structure of a display panel provided by an embodiment of the present disclosure along a direction perpendicular to a base substrate; and FIG. 4D is a schematic diagram of the principle of total reflection of light.

For example, a cross-sectional shape of the main structure 601 of the total reflection structure 6 along a direction perpendicular to the base substrate 1 is a trapezoidal shape or a rectangular shape. As illustrated in FIG. 4A, the cross-sectional shape of the main structure 601 is the trapezoidal shape, and a length of an upper side of the trapezoidal shape is smaller than a length of a bottom side of the trapezoidal shape. Because the refractive index of the second structure 602 is greater than the refractive index of the main structure 601, thus in a case where the light emitted by the light emitting device 13 is emitted towards the interface between the second structure 602 and the main structure 601, the critical angle at which total reflection occurs is an angle γ. In a case where the incidence angle is greater than the angle γ, this portion of light can be totally reflected back to the light emitting region 101. In a case where the incidence angle is the angle γ, an included angle between the incident light and the base substrate 1 is an angle a, and as for at least a portion of the light which portion has an included angle larger than a with the base substrate 1, the incidence angle of the portion of the light is greater than the angle γ, and this portion of the light can be totally reflected. In addition, according to the principle of total reflection, the larger the difference between the refractive index of the second structure 602 and the refractive index of the main structure 601, the smaller the critical angle C, and the larger the range of the total reflected light. The cross-sectional shape of the main body structure 601 illustrated in FIG. 3A is the situation illustrated in FIG. 4A, but the cross-sectional shape is not limited to such a shape. For example, the cross-sectional shape of the main structure 601 can also be a rectangular shape as illustrated in FIG. 4B or a trapezoidal shape as illustrated in FIG. 4C, a length of an upper side of the trapezoidal shape is greater than a length of a bottom side of the trapezoidal shape. In FIG. 4B, the critical angle of total reflection is the angle γ, and in a case where the incidence angle is the angle γ, the included angle between the incident light and the base substrate 1 is an angel b. Similarly, the incident light having an angle larger than the angle b with the base substrate 1 can be totally reflected. In FIG. 4C, the critical angle of total reflection is the angel γ, and in a case where the incidence angle is the angel γ, the included angle between the incident light and the base substrate 1 is an angel c. Similarly, the incident light having an included angle larger than the angel c with the base substrate 1 is totally reflected. Obviously, the angel c<the angel b<the angel a, therefore, ranges of light that is totally reflected at the interface between the second structure 602 and the main structure 601 in the situations respectively illustrated in FIGS. 4A, 4B, and 4C sequentially increase, and the increasing of the range of light that is totally reflected is advantageous for better alleviating the above-mentioned undesirable phenomenon because of the transmission of light in the lateral direction.

It should be noted that the above-mentioned types of the cross-sectional shape of the main structure 601 are only some embodiments. In other embodiments of the present disclosure, the cross-sectional shape of the main structure 601 is not limited to the types mentioned above.

For example, a material of the total reflection structure 6 is a transparent material, and for example, both the main structure 601 and the second structure 602 are transparent structures, so that the transmission of light emitted from the light emitting device 13 in the vertical direction is not blocked. Of course, in at least one embodiment of the present disclosure, the main structure 601 of the total reflection structure 6 can also comprise an opaque material. For example, a material of the main structure 601 of the total reflection structure 6 can be a first inorganic material, such as magnesium fluoride having a lower refractive index, or a first resin material; and a material of the second structure 602 of the total reflection structure 6 is a second inorganic material, such as silicon nitride having a higher refractive index, or a second resin material. The first inorganic material is different from the second inorganic material, and the first resin material is different from the second resin material. A refractive index of the first resin material is smaller than a refractive index of the second resin material. For example, the first resin material can be a resin having a lower refractive index such as polymethyl methacrylate (PMMA), polyallyl diglycol carbonate (PADC) or the like, and the second resin material can be a resin having a higher refractive index such as polystyrene (PS), Polycarbonate (PC) or an epoxy resin of higher refractive index incorporating a high refractive index atom such as sulfur or halogen. It should be noted that the first resin material and the second resin material are not limited to the above-mentioned types, and the first resin material and the second resin material can also be other materials that satisfy that the refractive index of the first resin material is smaller than the refractive index of the second resin material.

For example, the light emitting device 13 comprises an anode 7 disposed on the planarization layer, a light emitting layer 8 disposed on the anode 7, and a cathode 11 covering the light emitting layer 8. In an embodiment of the present disclosure, the light emitting device 13 is of a bottom emission type, and light emitted from the light emitting layer 8 is emitted out from a lower side of the base substrate 1. For example, the cathode 11 is a reflective layer, or a separate reflective layer is disposed adjacent to the cathode 11, so that a part of the light emitted by the light emitting layer 8 can be reflected, which is advantageous for increasing the transmittance ratio of light, thereby utilization of light is improved. For example, the cathode 11 is a metal layer having a surface with a higher reflectivity, for example, the metal comprises aluminum, silver, or the like. Of course, the material of the cathode 11 is not limited to the above mentioned types, and the embodiments of the present disclosure are not limited in this aspect.

For example, the display panel 10 further comprises a pixel driving circuit disposed on the base substrate 1, and at least a portion of the pixel driving circuit is covered by the total reflection structure 6 in a direction perpendicular to the base substrate 1. As illustrated in FIG. 2 and FIG. 3A, for example, the pixel driving circuit can comprise a thin film transistor 4, a gate line 20, a data line 21 and so on, and the thin film transistor 4 comprises a gate electrode, a semiconductor layer on the gate electrode, and a source electrode and a drain electrode that are separately disposed on the semiconductor layer. The display panel 10 further comprises a gate insulating layer 2 covering the gate electrode, an interlayer insulating layer 3 covering the semiconductor layer, and a passivation layer 5 covering the thin film transistor 4 and the base substrate 1. A through hole 12 is provided in the planarization layer (the second structure of the total reflection structure), so that a portion of the anode 7 of the light emitting device 13 can contact with the drain electrode through the through hole 12, thereby an electrical connection between the anode 7 and the drain electrode is realized. In a direction perpendicular to the base substrate 1, a portion of the thin film transistor 4, a portion of the gate line 20 and a portion of the data line 21 are covered by the reflective structure 6. Therefore, the total reflection structure 6 can also alleviate or avoid the problem that the light transmitting simultaneously in the vertical direction and the lateral direction irradiates to the thin film transistor 4, thereby alleviating or avoiding the problem of affecting the display function because of the occurrence of photo-induced leakage of the thin film transistor 4.

For example, the display panel 10 further comprises a pixel definition layer 9, and the pixel definition layer 9 comprises a pixel dividing portion disposed between the light emitting devices and an opening portion corresponding to the light emitting region 101 to define the plurality of pixel units. As illustrated in FIG. 2, the pixel dividing portion of the pixel definition layer 9 can be disposed around the light emitting region 101. For example, as illustrated in FIG. 3A, the pixel dividing portion is on the total reflection structure 6, and the pixel dividing portion overlaps the total reflection structure 6 in a direction perpendicular to the base substrate 1. Of course, the pixel dividing portion can also overlap a portion of the total reflection structure 6.

FIG. 3B illustrates another embodiment of the present disclosure, which differs from the embodiment illustrated in FIG. 3A in that the second structure 602 of the total reflection structure 6 covers the upper surface 6011, which is away from the substrate 1, of the main structure 601, that is, the planarization layer covers the main structure 602 of the total reflection structure 6. This structure can also prevent the light transmitting in the lateral direction from entering the light emitting region of the adjacent pixel unit or reduce the light that enters the light emitting region of the adjacent pixel unit by the above-mentioned principle of total reflection, and achieve the same or similar technical effect as the embodiment illustrated in FIG. 3A. Moreover, compared with the structure that the upper surface 6021, which is away from the base substrate 1, of the second structure 602 and the upper surface 6011, which is away from the base substrate 1, of the main structure 601 are substantially flush, the manufacture method of this structure is simpler.

The above embodiment is the situation where the second structure of the total reflection structure is the planarization layer at the same time, but in some other embodiments, the planarization layer can also not be used as the second structure of the total reflection structure. For example, as illustrated in FIG. 3C, the second structure 602 covers a side 6012, which faces the light emitting device 13, of the main structure 601 that. The display panel 10 further comprises a planarization layer 15 disposed above the base substrate 1, and the planarization layer 15 covers the total reflection structure 6 and the base substrate 1, and the light emitting device 13 is disposed on the planarization layer 15. This structure can also achieve the same or similar technical effects as the previously described embodiments. The materials of the main structure 601 and the second structure 602 and other structures of the display panel 10 are the same as those in FIG. 3A, please refer to the above description.

Figure 3D:
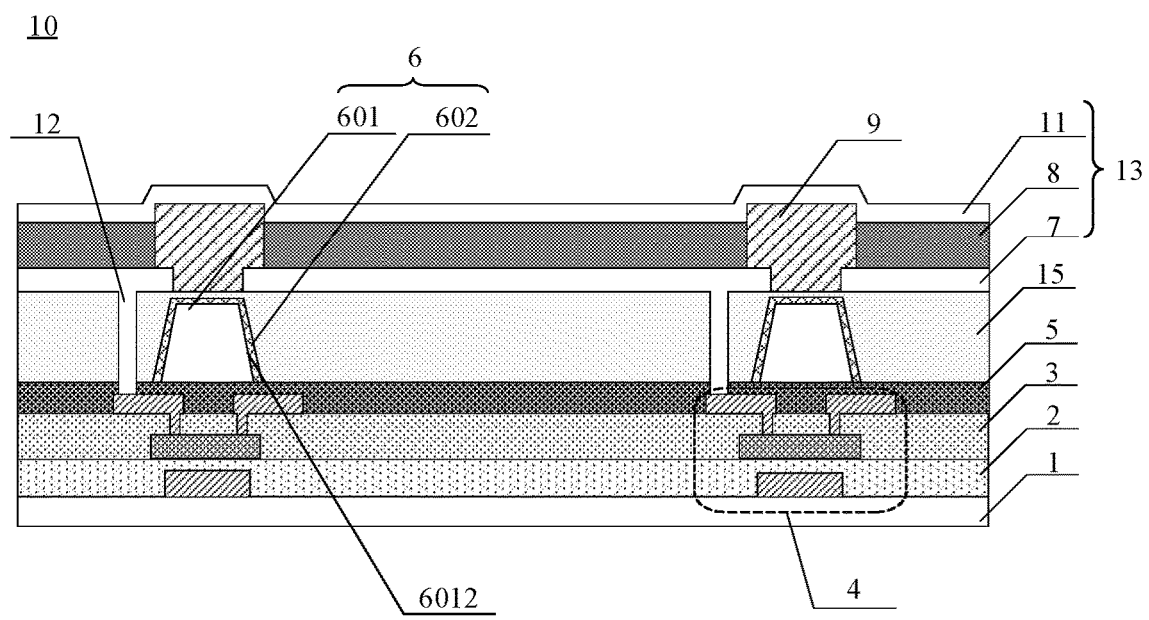
FIG. 3D is further another cross-sectional schematic diagram along line I-I' of FIG. 2.

For example, as illustrated in FIG. 3D, the second structure 602 of the total reflection structure 6 further covers the upper surface 6011, which is away from the base substrate 1, of the main structure 601, and the planarization layer 15 covers the total reflection structure 6 and the base substrate 1, this structure can also achieve the same or similar technical effects as the previously described embodiments. The materials of the main structure 601 and the second structure 602 and other structures of the display panel 10 are the same as those in FIG. 3A, please refer to the above description.

It should be noted that the embodiment of the present disclosure takes the light emitting device of a bottom emission type as an example. In other embodiments of the present disclosure, the light emitting device can also be a top emission type, and light is emitted from an upper side of the display panel that is away from the base substrate. In this situation, the total reflection structure is disposed on a side, which is away from the base substrate, of the light emitting device; alternatively, the light emitting device can be a double-side emission type. In this situation, total reflection structures are disposed on both the side, which faces the base substrate, of the light emitting device and the side, which is away from the base substrate, of the light emitting device that.

At least one embodiment of the present disclosure further provides a display device, the display device comprises any one of the display panels provided by the embodiments of the present disclosure. The display device can be an organic light emitting diode display device. For example, the display device can be implemented as any product or component having a display function such as a mobile phone, a tablet computer, a television, a display, a notebook computer, a digital photo frame, a navigator, or the like.

Figure 5:
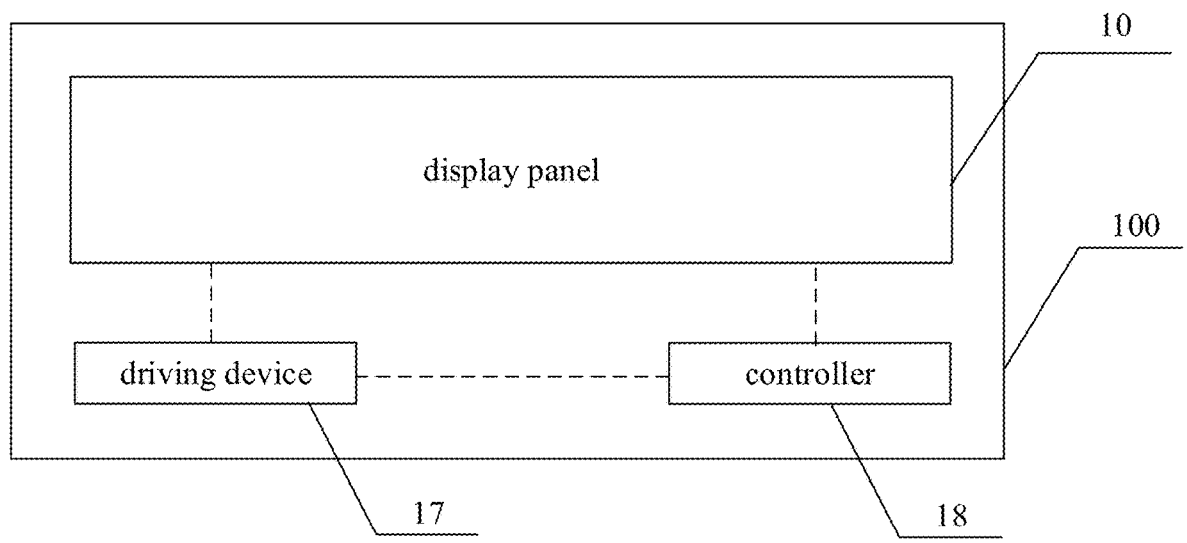
FIG. 5 is a schematic diagram of a display device provided by an embodiment of the present disclosure.

Illustratively, FIG. 5 is a schematic diagram of a display device provided by an embodiment of the present disclosure. As illustrated in FIG. 5, the display device 100 comprises any one of the display panels 10 provided by the embodiments of the present disclosure, and the display device 100 can further comprise a driving device 17 and a controller 18. The driving device 17 is configured to be capable of adjusting a potential signal applied to the electrodes of the light emitting device of each pixel region of the display panel 10 to form a driving electric field, thereby a display effect of the display device 100 during display is realized. The driving device 17 can be, for example, a driving circuit or the like. The controller 18 is configured to be capable of controlling an operation of the driving device 17, such as controlling serial display data and scan control timing to control the display state of the display device. The controller 18 can be implemented in various forms such as a central processing unit (CPU), a signal processor, a programmable controller (PLC), and the like.

For example, the display device 100 can also be a touch display device, and the display device 100 can further comprise a touch substrate (not shown in figures), a touch detection device (not shown in figures), and so on. In this situation, the controller 18 can also control a touch scan signal by controlling the driving device 17, and receive a detection result from the touch detection device, convert the detection result into coordinate information, and therefore control the display state of the display device. Those skilled in the art can rationally design a configuration mode and a use mode of the driving device and the controller according to requirements of a specific product.

It should be noted that the drawings of the embodiments of the present disclosure only show the schematic structure of the display device directly related to the display panel. As for other structures of the display device, those skilled in the art can refer to the conventional technology.

The display device provided by the embodiment of the present disclosure can prevent the light emitted by the light emitting device transmitting in the lateral direction from entering the light emitting region of the adjacent pixel unit or reduce the light that enters the light emitting region of the adjacent pixel unit, and alleviate or avoid the problem of crosstalk of a light emitting state of the light emitting region of the adjacent pixel unit, which is advantageous for achieving a better display quality.

At least one embodiment of the present disclosure provides a manufacture method of a display panel, the method comprises: providing a base substrate on which a plurality of pixel units are disposed in an array, each of the plurality of pixel units comprises a light emitting region; forming a light emitting device in the light emitting region; and forming a total reflection structure on a light exiting side of the light emitting device, the total reflection structure surrounds at least a portion the light emitting region; and the total reflection structure comprises a main structure and a second structure covering a side, which faces the light emitting device, of the main structure, and a refractive index of the second structure is greater than a refractive index of the main structure.

Figure 6A:
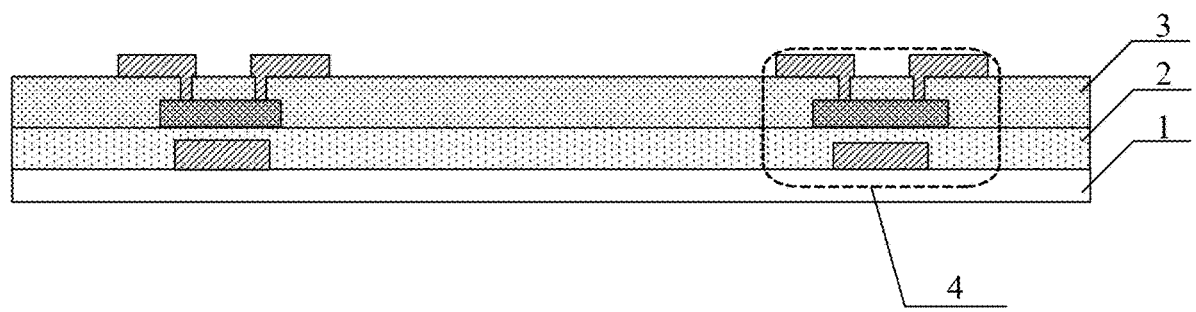
FIGS. 6A-6L are schematic diagrams of a manufacture method of a display panel provided by an embodiment of the present disclosure.
Figure 6B:
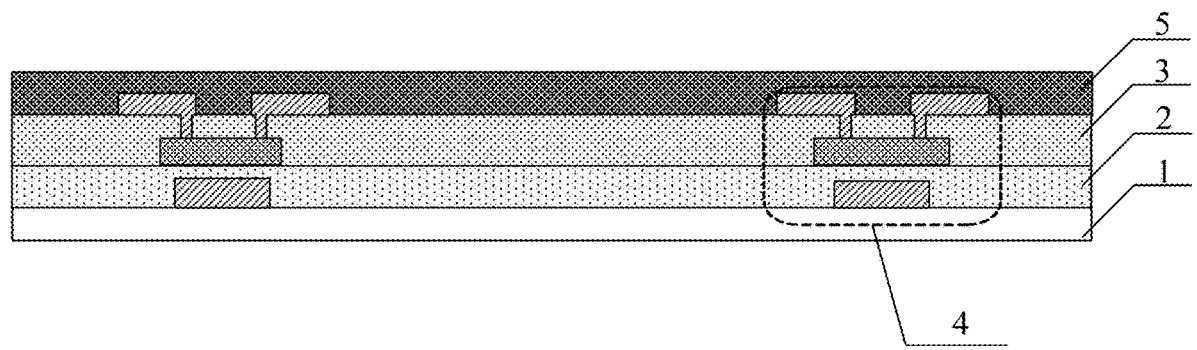

Hereinafter, manufacturing a display panel of a bottom emission type is taken as an example for detailed description. As illustrated in FIG. 6A, a base substrate 1 is provided, and a pixel driving circuit is disposed on the base substrate 1. The pixel driving circuit comprises thin film transistors 4 disposed in an array, gate lines and data lines (not shown in figures) respectively disposed laterally and vertically, and the like. The gate lines and the data lines define a plurality of pixel units disposed in an array on the base substrate 1, and each of the plurality of pixel units comprises a light emitting region. A gate insulating layer 2 covering a gate electrode of the thin film transistor 4 and an interlayer insulating layer 3 covering a semiconductor layer are further provided on the base substrate 1. As illustrated in FIG. 6B, a passivation layer 5 covering the thin film transistor 4 and the base substrate 1 is formed to protect the base substrate 1 and the pixel driving circuit disposed on the base substrate 1. The above structures and steps can be performed referring to conventional techniques in the art.

Figure 6C:
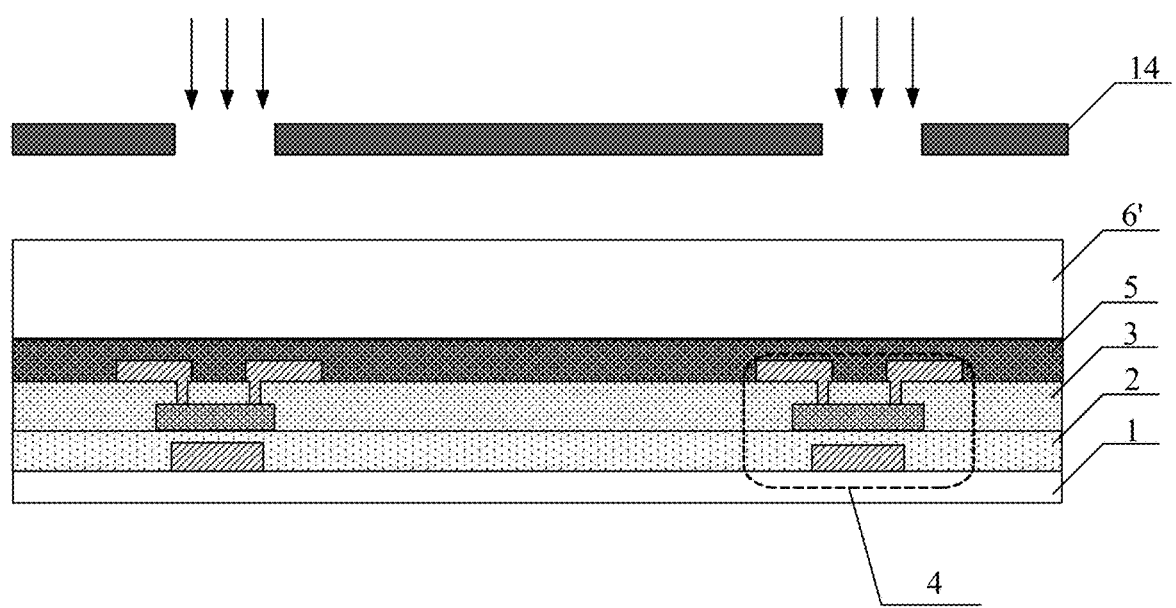
Figure 6D:
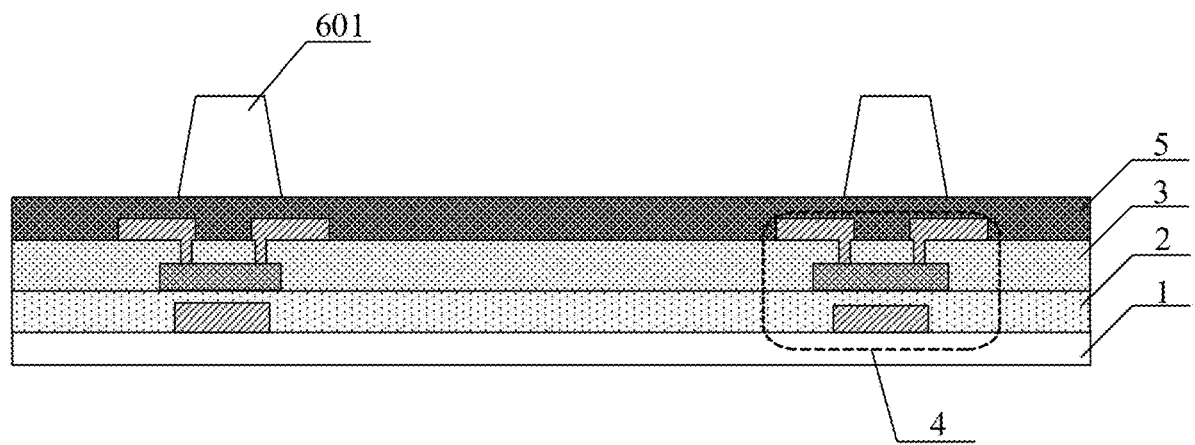

The manufacture method of a display panel comprises forming a total reflection structure 6 on a light exiting side of the light emitting device 13. In an embodiment of the present disclosure, the display panel is of a bottom emission type, so the total reflection structure 6 is formed under the light emitting device 13. The total reflection structure 6 comprises a main structure 601 and a second structure 602 that covers a side 6012, which faces the light emitting device, of the main structure 601. Specifically, for example, as illustrated in FIG. 6C, a main structure layer 6' is formed on the passivation layer 5 for forming the main structure 601 of the total reflection structure 6, and the total reflection structure 6 surrounds at least a portion of the light emitting region. For example, in a case where a material of the main structure layer 6' is the above-mentioned first resin material and the first resin material is a photosensitive resin material, the main structure layer 6' can be formed by a method such as coating (spin coating or knife coating) and the like. In a case where the material of the main structure layer 6' is the above-mentioned first inorganic material, for example, is magnesium fluoride, the main structure layer 6' can be formed by a method such as evaporation, chemical vapor deposition and the like. For example, the main structure of the total reflection structure can be formed by an exposure-development process using a mask. As illustrated in FIG. 6C, the main structure layer 6' can be covered by a mask 14, the mask 14 comprises an exposed region and a non-exposed region. For example, where the main structure layer 6' comprises a photosensitive resin having positive photoresist properties, the portion of the main structure layer 6' used for forming the main structure corresponds to the non-exposed region, and other portions correspond to the exposed region. An appropriate exposure intensity is adopted, and the exposure intensity of the portion of the main structure layer 6' corresponding to the exposed portion gradually decreases from the position that is away from the base substrate 1 to the position that is close to the base substrate 1. The development process is performed after the exposure process, and the main structure 601 as illustrated in FIG. 6D is formed, and a cross-sectional shape of the main structure 601 along a direction perpendicular to the base substrate 1 is a trapezoidal shape, and a length of an upper side of the trapezoidal shape is smaller than a length of a bottom side. For example, in a case where the main structure layer 6' comprises a photosensitive resin having negative photoresist properties, the portion of the main structure layer 6' for forming the main structure corresponds to the exposed region, and other portions correspond to the non-exposed region. An appropriate exposure intensity is adopted, and the exposure intensity of the portion of the main structural layer 6' corresponding to the exposed portion gradually decreases from the position that is away from the base substrate 1 to the position that is close to the base substrate 1. The development process is performed after the exposure process, and the main structure 601 as illustrated in FIG. 4A is formed, and the cross-sectional shape of the main structure 601 along a direction perpendicular to the base substrate 1 is a trapezoidal shape, and a length of an upper side of the trapezoidal shape is greater than a length of a bottom side. For example, in a case where the exposure process performs a large exposure intensity, the exposure intensity of the portion of the main structural layer 6' corresponding to the exposed portion is sufficiently from the position that is away from the base substrate 1 to the position that is close to the base substrate 1. The development process is performed after the exposure process, and the main structure 601 as illustrated in FIG. 4B is formed, and the cross-sectional shape of the main structure 601 along a direction perpendicular to the base substrate 1 is a rectangular shape. Those skilled in the art can design a corresponding exposure method according to the specific shape of the main structure 601 to be formed, which is not limited by the embodiments of the present disclosure.

Figure 6E:
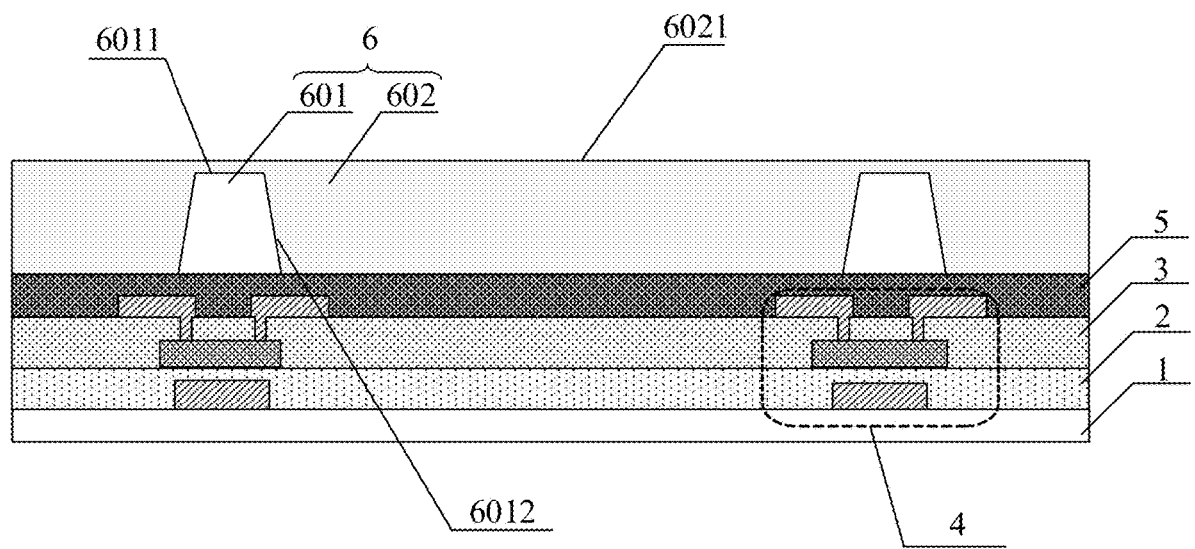
Figure 6F:
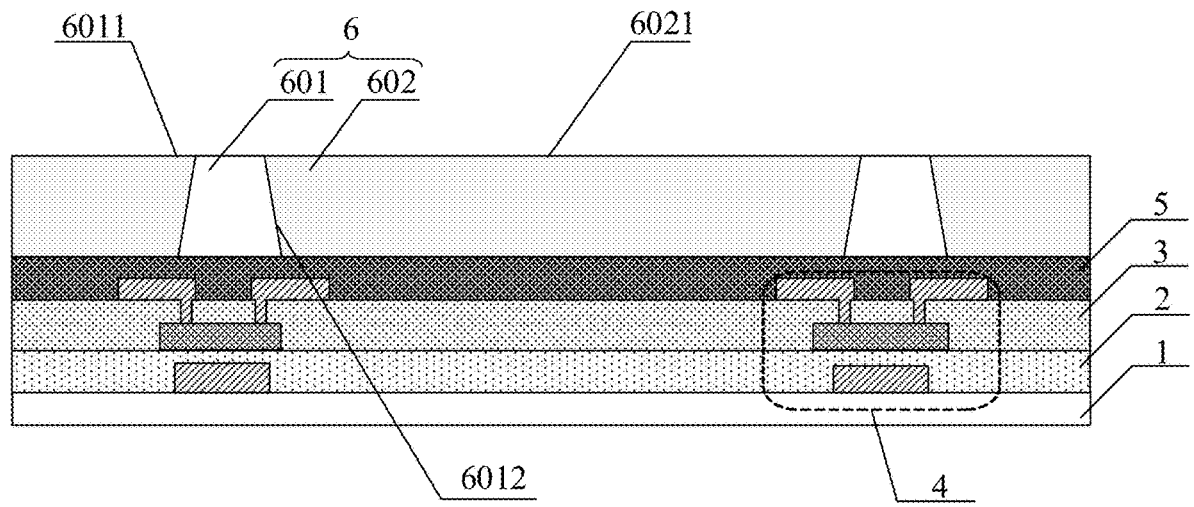
Figure 6G:
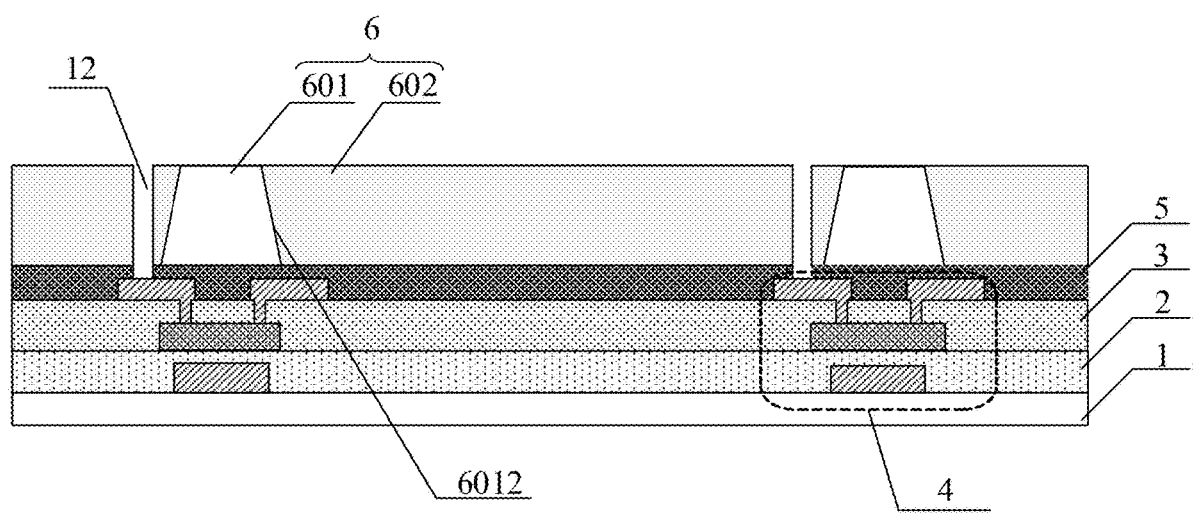

As for forming the second structure 602, for example, forming the total reflection structure 6 comprises forming a planarization layer covering the base substrate 1 as the second structure 602 of the total reflection structure 6. As illustrated in FIG. 6F, the upper surface 6021, which is away from the base substrate 1, of the planarization layer and the upper surface 6011, which is away from the base substrate 1, of the main structure 601 are substantially flush; alternatively, as illustrated in FIG. 6E, the planarization layer covers the main structure 601. The refractive index of the second structure 602 is greater than the refractive index of the main structure 601, and the material of the second structure 602 can be the above-mentioned second resin material or silicon nitride. Please refer to the description in the above at least one embodiment for the specific material, and details are not described here. An appropriate method can be selected to form the second structure 602 according to the specific material type of the second structure 602. For example, in a case where the material of the second structure 602 is silicon nitride, the chemical vapor deposition method can be used; in a case where the material of the second structure 602 is the second resin material mentioned in the above embodiment, the coating method can be used.

As illustrated in FIG. 6O, a through hole 12 exposing a portion of the drain electrode is formed in the planarization layer and the passivation layer 5, and the through hole 12 can be formed, for example, by a photolithography method.

Figure 6H:
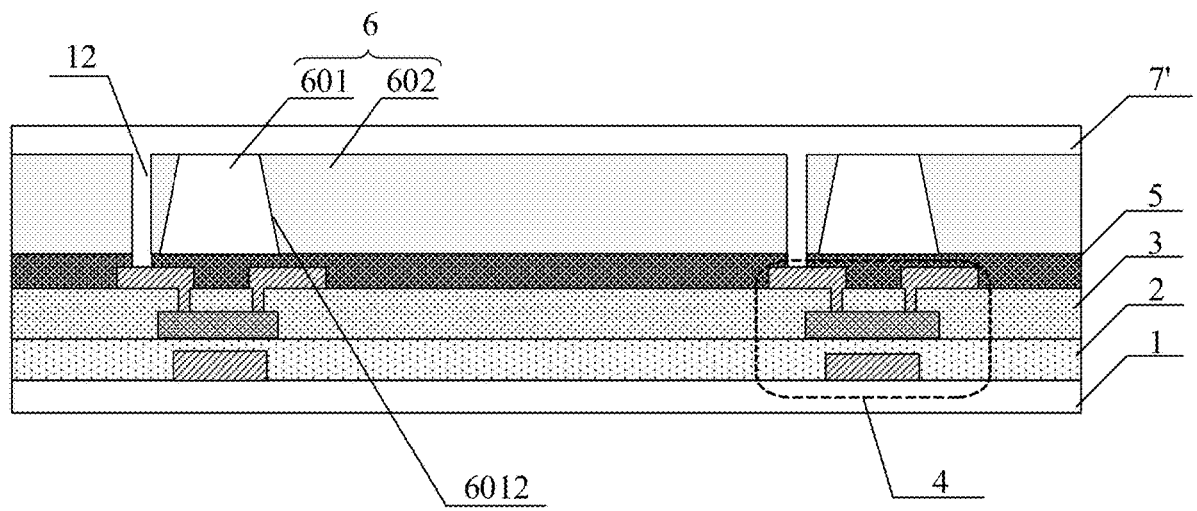
Figure 6I:
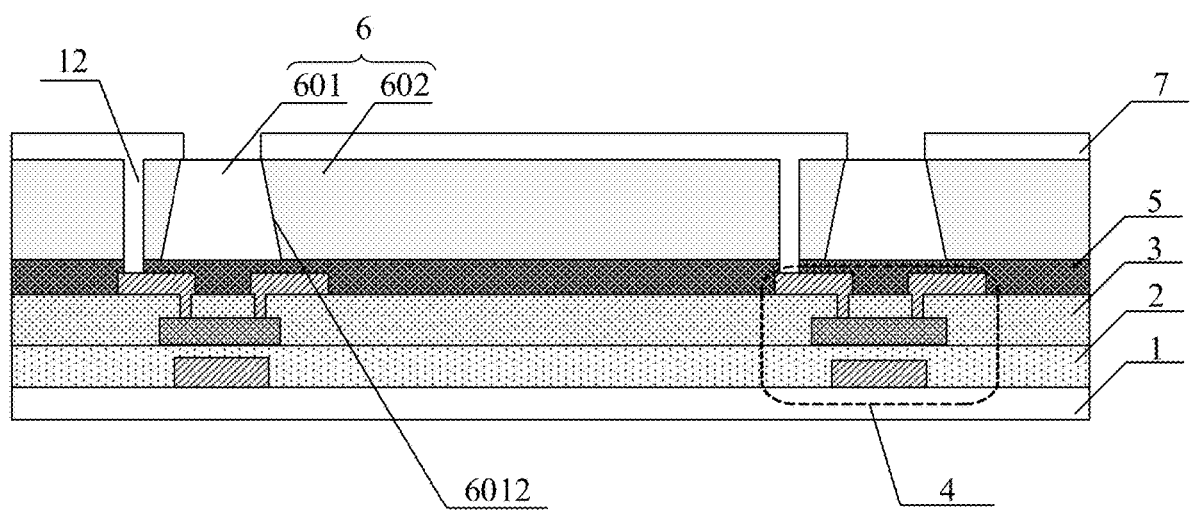

For example, the manufacture method of a display panel further comprises forming a light emitting device in the light emitting region, and the light emitting device can be formed by an evaporation method. Forming the light emitting device can comprise forming an anode on the planarization layer; forming a light emitting layer on the anode; and forming a cathode on the light emitting layer. Specifically, as illustrated in FIG. 6H, an anode layer 7' used for forming the anode is formed on the planarization layer. A portion of the anode layer contacts with the drain electrode via the through hole 12 to achieve electrical contact of the anode layer 7' with the drain electrode. As illustrated in FIG. 6I, the anode layer 7' can be patterned by a photolithography method to form an anode 7 in the light emitting region, and an opening is formed at a position corresponding to the total reflection structure 6.

Figure 6J:
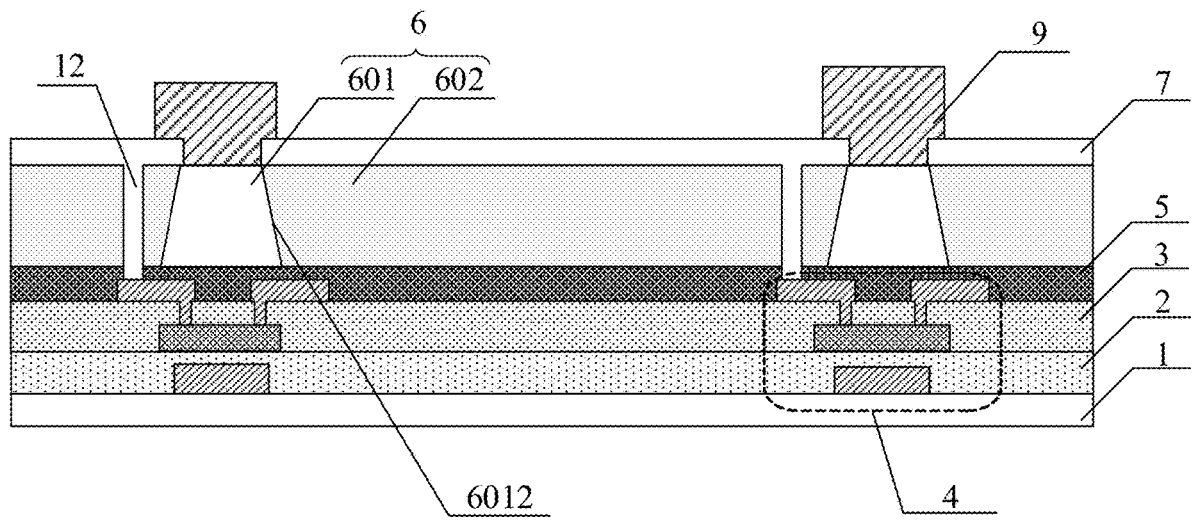

For example, as illustrated in FIG. 6J, the manufacture method of a display panel further comprises forming a pixel definition layer 9. For example, the pixel definition layer 9 can be formed on the total reflection structure 6 by a photolithography method. The pixel definition layer 9 comprises a pixel dividing portion disposed between the light emitting devices and an opening portion corresponding to the light emitting region to define a plurality of pixel regions, which is advantageous for preventing crosstalk of adjacent light emitting regions. The pixel dividing portion of the pixel definition layer 9 can be disposed around the light emitting region 101. The pixel dividing portion overlaps the total reflection structure 6 in a direction perpendicular to the base substrate 1. Of course, the pixel dividing portion can also overlap a portion of the total reflection structure 6.

Figure 6K:
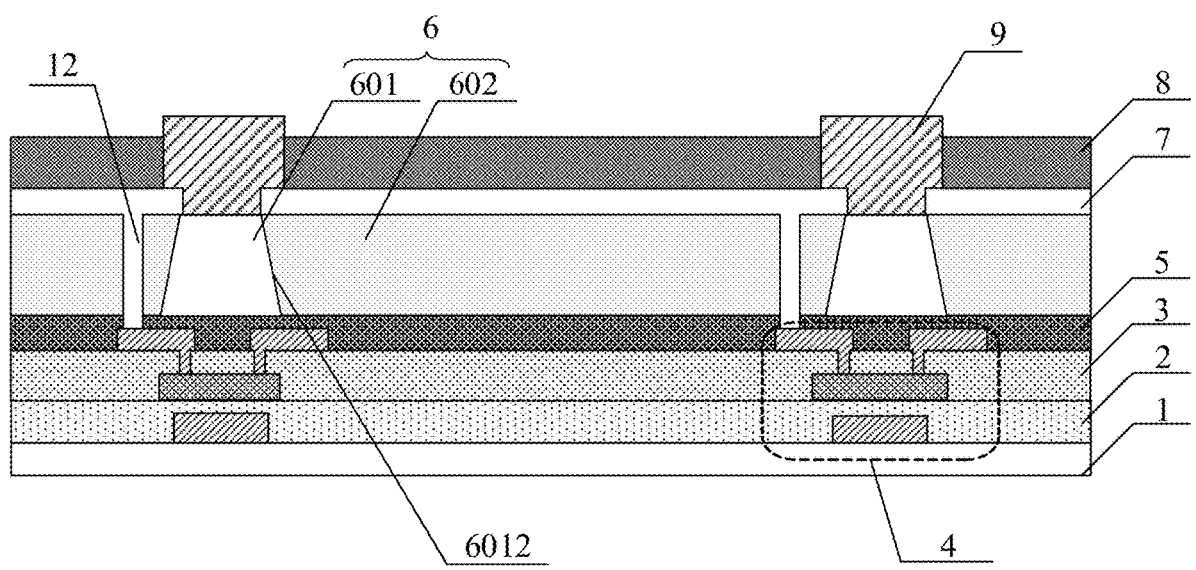
Figure 6L:
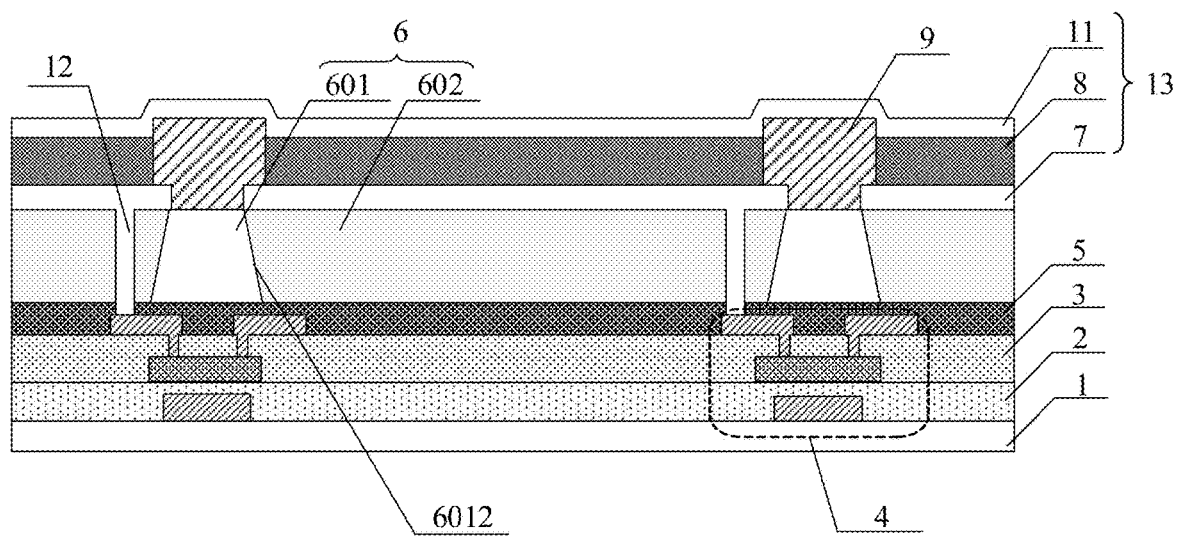

As illustrated in FIG. 6K, forming a light emitting layer 8 in the light emitting region. For example, the light emitting layer 8 comprises an organic light emitting material. As illustrated in FIG. 6L, a cathode 11 is formed on the light emitting layer 8, and the cathode 11 covers the light emitting layer and the pixel definition layer 9. Therefore, a display panel as illustrated in FIG. 6L is formed.

It should be noted that, in an embodiment of the present disclosure, the light emitting device 13 is of a bottom emission type, so the cathode 11 is a reflective layer, and can be formed of a metal material having a high reflectivity, such as aluminum, silver or the like; alternatively, or a separate reflective layer can be provided adjacent to the cathode 11, and the reflective layer can be formed of a metal material. A material of the anode 7 is a transparent conductive material to facilitate light emission, such as indium tin oxide (ITO), indium zinc oxide (IZO) or the like. In addition, in the embodiment illustrated in FIGS. 6A-6L, the total reflection structure is formed prior to the light emitting device, but in other embodiments, the total reflection structure can also be formed after the light emitting device is formed, and the embodiments of the present disclosure are not limited to the forming sequence of the light emitting devices and the total reflection structure.

In the display panel manufactured by the method provided by the embodiment illustrated in FIGS. 6A-6L, because the refractive index of the second structure 602 is greater than the refractive index of the main structure 601, according to the principle of total reflection of light, in a case where the incidence angle of the incident light is greater than the critical angle, this portion of the incident light is totally reflected, which can prevent the light transmitting in the lateral direction from entering the light emitting region of the adjacent pixel unit or reduce light that enters the adjacent pixel unit, thereby alleviating or avoiding the crosstalk of the light emitting state of the light emitting region of the adjacent pixel unit, which is advantageous for achieving a better display quality.

In the embodiment illustrated in FIGS. 6A-6L, at least a portion of the pixel driving circuit is covered by the total reflection structure in a direction perpendicular to the base substrate 1. For example, a portion of the thin film transistor 4, a portion of the gate line 20 and a portion of the data line 21 are covered by the total reflection structure 6. Therefore, the total reflection structure 6 can also prevent the light transmitting simultaneously in the vertical direction and the lateral direction from irradiating to the thin film transistor 4 or reduce light that irradiates to the thin film transistor 4, thereby the problem of affecting the display function because of the occurrence of photo-induced leakage of the thin film transistor 4 is alleviated or avoided.

Figure 7A:
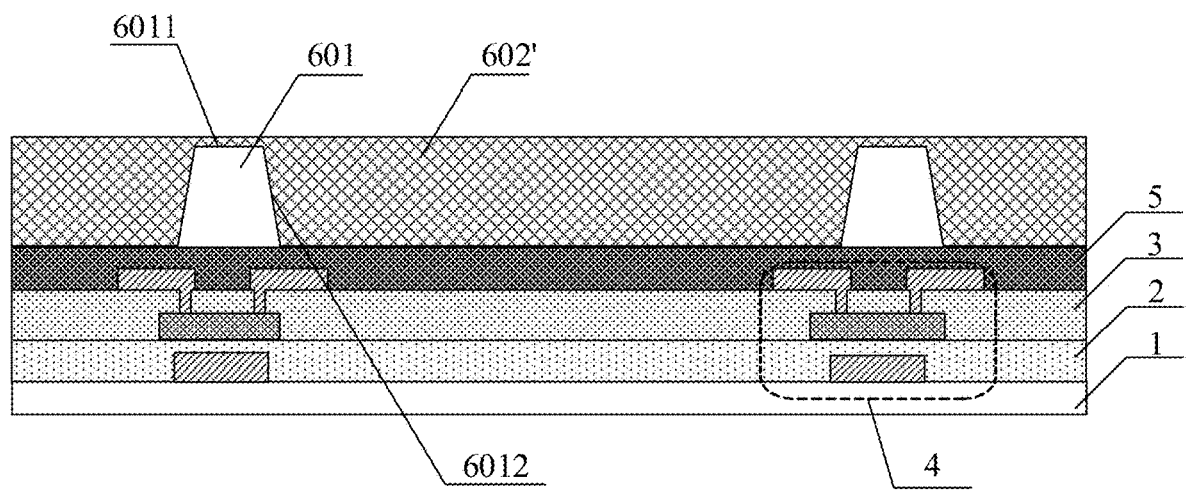
FIG. 7A-7E are schematic diagrams of another manufacture method of a display panel provided by an embodiment of the present disclosure.
Figure 7B:
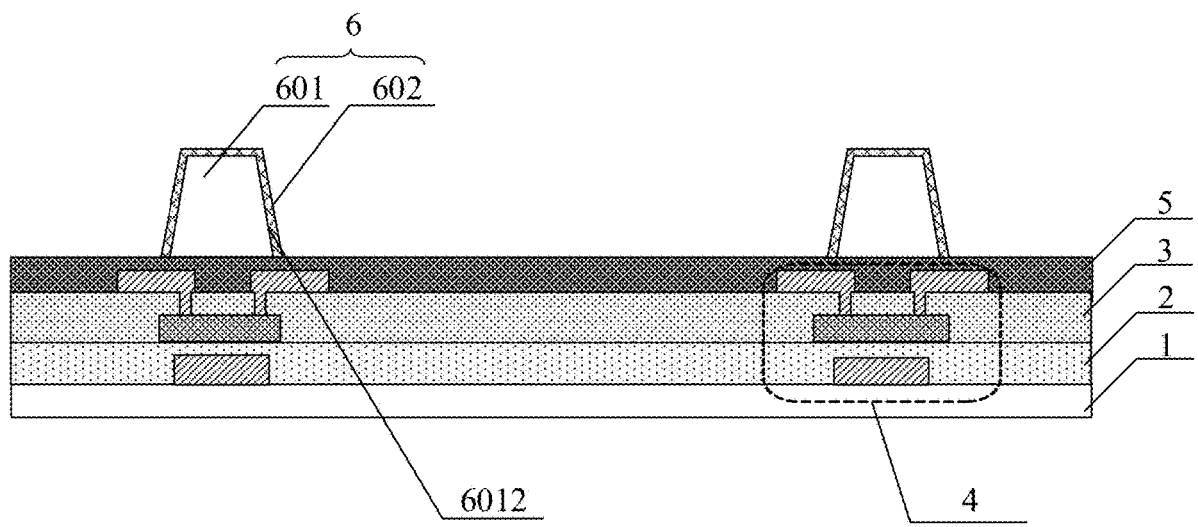
Figure 7C:
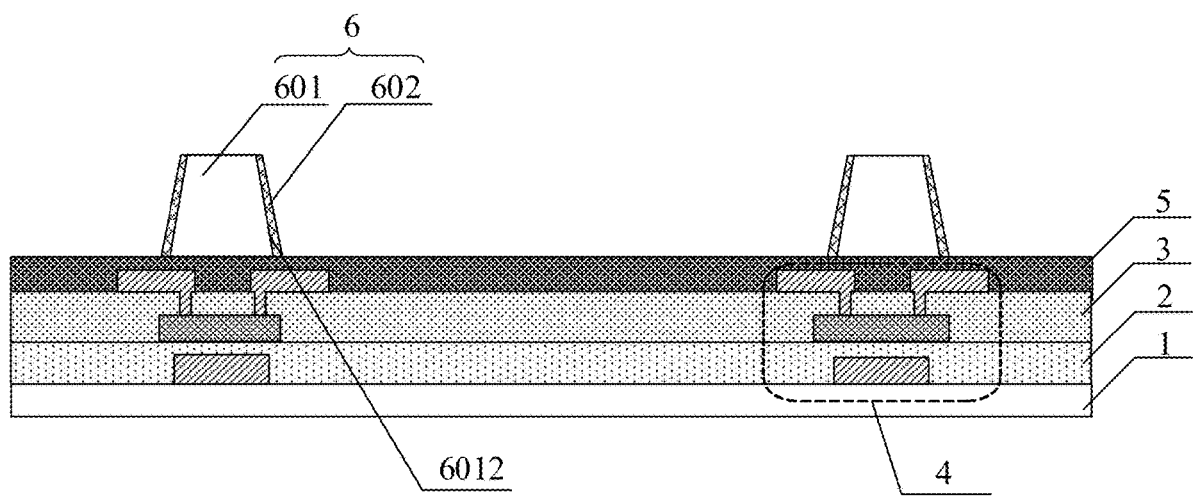

The above embodiment illustrates the situation where the planarization layer is used as the second structure of the total reflection structure, but the planarization layer can also not be used as the second structure. For example, as illustrated in FIG. 7A, after the main structure 601 of the total reflection structure 6 is formed by the above method, a second structure layer 602' covering the main structure 601 is formed. The second structure layer 602' is patterned by a photolithography process or an exposure-development process to form a second structure 602 covering the main structure 601 as illustrated in FIG. 7B; alternatively, a second structure 602 covering the side 6012 of the main structure 601 as illustrated in FIG. 7C is formed. As for forming the second structure 602 in FIG. 7C, for example, a portion of the second structure layer 602' covering the upper surface 6011 of the main structure 601 can be removed by an etching method or a grinding method (for example, a chemical mechanical polishing method); alternatively, in other embodiments, during the process of forming the second structure layer 602', the upper surface of the second structure layer 602' is formed to be substantially flush with the upper surface of the main structure. The material of the second structure 602 can be a second inorganic material, such as silicon nitride, or a second resin material, please refer to detail descriptions in the above at least one embodiment, and those skilled in the art can select a specific process of patterning according to material properties of the second structure 602.

Figure 7D:
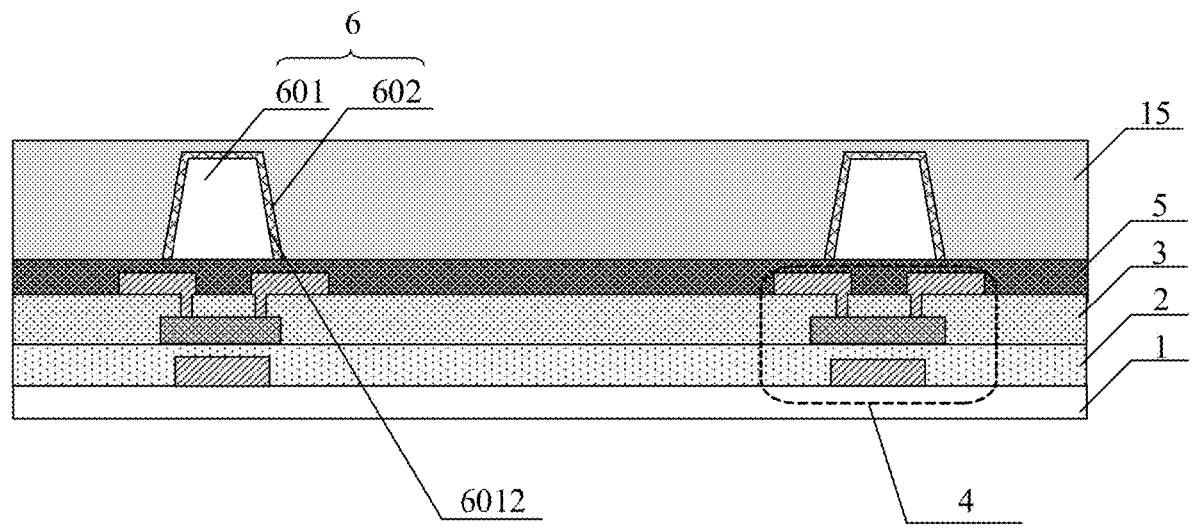
Figure 7E:
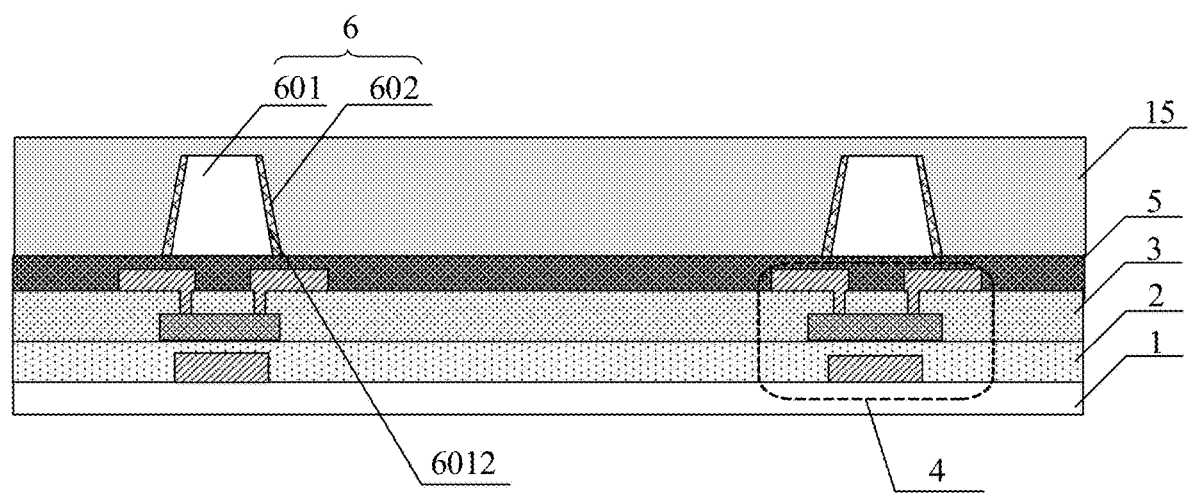

For example, the manufacture method of a display panel provided by the embodiment illustrated in FIG. 7D or FIG. 7E further includes forming a planarization layer 15 on the base substrate 1, and the planarization layer 15 covers the total reflection structure 6 and the base substrate 1 to provide a flat surface for disposing the light emitting device 13. The subsequent steps are the same as the steps in the embodiment illustrated in FIGS. 6G-6L, please refer to the previous description. The display panel formed by this method can achieve the same or similar technical effects as the display panel formed by the embodiment illustrated in FIGS. 6A-6L.

What are described above is related to the illustrative embodiments of the disclosure only and not limitative to the scope of the disclosure; the scopes of the disclosure are defined by the accompanying claims.

What is claimed is:

1. A display panel, comprising:
   a base substrate;
   a plurality of pixel units in an array, wherein each of the plurality of pixel units comprises a light emitting region and a light emitting device in the light emitting region; and
   a total reflection structure disposed on a light exiting side of the light emitting device and surrounding at least a portion of the light emitting region,
   wherein the total reflection structure comprises a main structure and a second structure, the main structure comprises an upper surface away from the base substrate and a side surface intersecting with the upper surface, the second structure covers the upper surface of the main structure and the side surface of the main structure, the second structure is in direct contact with both the upper surface of the main structure and the side surface of the main structure, and a refractive index of the second structure is greater than a refractive index of the main structure.

2. The display panel according to claim 1, wherein the second structure of the total reflection structure is further configured to be a planarization layer covering the base substrate,
   the planarization layer covers the main structure of the total reflection structure.

3. The display panel according to claim 1, wherein a cross-sectional shape of the main structure of the total reflection structure along a direction perpendicular to the base substrate is a trapezoidal shape or a rectangular shape.

4. The display panel according to claim 1, wherein a material of the total reflection structure is a transparent material.

5. The display panel according to claim 4, wherein a material of the main structure of the total reflection structure is a first inorganic material or a first resin material, and a material of the second structure of the total reflection structure is a second inorganic material or a second resin material;
   the first inorganic material and the second inorganic material are different, and the first resin material and the second resin material are different.

6. The display panel according to claim 1, further comprising a planarization layer, wherein the planarization layer is disposed on the base substrate and covers the total reflection structure and the base substrate, and
   the light emitting device is disposed on the planarization layer.

7. The display panel according to claim 6, wherein the light emitting device comprises:
   an anode on the planarization layer;
   a light emitting layer on the anode; and
   a cathode covering the light emitting layer,
   wherein the light emitting device is of a bottom emission type.

8. The display panel according to claim 1, wherein the display panel further comprises a pixel driving circuit on the base substrate;
   at least a portion of the pixel driving circuit is covered by the total reflection structure in a direction perpendicular to the base substrate.

9. The display panel according to claim 1, further comprising:
   a pixel definition layer, comprising a pixel dividing portion between the light emitting devices and an opening portion corresponding to the light emitting region.

10. A display device, comprising the display panel according to claim 1.

11. A manufacture method of a display panel, comprising:
    providing a base substrate comprising a light emitting region;
    forming a light emitting device in the light emitting region; and
    forming a total reflection structure on a light exiting side of the light emitting device, wherein the total reflection structure surrounds at least a portion of the light emitting region, and
    the total reflection structure comprises a main structure and a second structure, the main structure comprises an upper surface away from the base substrate and a side surface intersecting with the upper surface, the second structure covers the upper surface of the main structure and the side surface of the main structure, the second structure is in direct contact with both the upper surface of the main structure and the side surface of the main structure, and a refractive index of the second structure is greater than a refractive index of the main structure.

12. The manufacture method according to claim 11, wherein forming of the total reflection structure comprises:
    forming a planarization layer covering the base substrate as the second structure of the total reflection structure,
    wherein the planarization layer covers the main structure of the total reflection structure.

13. The manufacture method according to claim 11, further comprising forming a planarization layer on the base substrate, wherein the planarization layer covers the total reflection structure and the base substrate.

14. The manufacture method according to claim 11, wherein the display panel further comprises a pixel driving circuit disposed on the base substrate; and
    at least a portion of the pixel driving circuit is covered by the total reflection structure in a direction perpendicular to the base substrate.

15. The display panel according claim 3, wherein a length of an upper side of the trapezoidal shape is greater than a length of a bottom side of the trapezoidal shape.

16. The display panel according claim 3, wherein a length of an upper side of the trapezoidal shape is smaller than a length of a bottom side of the trapezoidal shape.

17. The manufacture method according to claim 11, wherein a cross-sectional shape of the main structure of the total reflection structure along a direction perpendicular to the base substrate is a trapezoidal shape or a rectangular shape.

18. The manufacture method according claim 17, wherein a length of an upper side of the trapezoidal shape is greater than a length of a bottom side of the trapezoidal shape.

19. The manufacture method according claim 17, wherein a length of an upper side of the trapezoidal shape is smaller than a length of a bottom side of the trapezoidal shape.

* * * * *